(12) United States Patent
Furukawa et al.

(10) Patent No.: US 6,940,134 B2
(45) Date of Patent: Sep. 6, 2005

(54) SEMICONDUCTOR WITH CONTACT CONTACTING DIFFUSION ADJACENT GATE ELECTRODE

(75) Inventors: Toshiharu Furukawa, Essex Junction, VT (US); Mark C. Hakey, Fairfax, VT (US); Steven J. Holmes, Milton, VT (US); David V. Horak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 10/064,316

(22) Filed: Jul. 2, 2002

(65) Prior Publication Data

US 2004/0004290 A1 Jan. 8, 2004

(51) Int. Cl.[7] .................. H01L 29/76; H01L 27/088
(52) U.S. Cl. .................. 257/382; 257/383; 257/900
(58) Field of Search ............... 257/382–387, 257/401, 410–413, 900, 905, 773, 774; 438/300, 303, 284, 286, 184, 216, 230, 265, 585, 595, 629, 637, 639, 640, 667, 668, 672, 675

(56) References Cited

U.S. PATENT DOCUMENTS

| | | | |
|---|---|---|---|
| 4,899,202 A | * | 2/1990 | Blake et al. ............ 257/336 |
| 5,043,778 A | * | 8/1991 | Teng et al. ............ 257/374 |
| 5,369,303 A | * | 11/1994 | Wei .................. 257/751 |
| 5,464,793 A | | 11/1995 | Roehl |
| 5,691,561 A | | 11/1997 | Goto |
| 5,792,703 A | | 8/1998 | Bronner et al. |
| 5,879,997 A | * | 3/1999 | Lee et al. ............ 438/300 |
| 5,899,742 A | | 5/1999 | Sun |
| 5,928,969 A | | 7/1999 | Li et al. |
| 5,997,757 A | | 12/1999 | Nagayama et al. |
| 6,100,185 A | * | 8/2000 | Hu .................. 438/642 |
| 6,271,108 B1 | | 8/2001 | Choe |
| 6,274,468 B1 | | 8/2001 | Hsu |
| 6,274,471 B1 | | 8/2001 | Huang |
| 6,281,143 B1 | | 8/2001 | Huang et al. |
| 6,294,449 B1 | | 9/2001 | Wu et al. |
| 6,316,311 B1 | | 11/2001 | Chen et al. |
| 6,426,263 B1 | * | 7/2002 | Chittipeddi ............ 438/281 |

* cited by examiner

*Primary Examiner*—Hung Vu
(74) *Attorney, Agent, or Firm*—Anthony Canale; Hoffman, Warnick & D'Alessandro LLC

(57) ABSTRACT

Methods of forming a contact to a gate electrode or substrate despite misalignment of the contact opening due to lithographic techniques, and a semiconductor having such a contact. Silicide can be created on the gate and/or diffusion using the invention.

5 Claims, 21 Drawing Sheets

SEMICONDUCTOR WITH CONTACT CONTACTING DIFFUSION ADJACENT GATE ELECTRODE

BACKGROUND OF THE INVENTION

Technical Field

The present invention relates generally to semiconductor contacts and, more particularly, to a contact and related methods.

Certain semiconductor manufacturing processes have advanced towards achieving smaller devices, while other processes have not advanced as far. The resulting incongruity between processes hinders the overall advancement towards higher density devices. This problem arises, for instance, when the image size used for certain structures is smaller than that used to create related structures. One area where this occurs is the formation of gates and fully landed contacts to those gates or adjacent diffusions. In particular, gates are now capable of creation in sub-lithographic size ranges using, for example, phase shifts masks and/or side wall image transfer techniques. Unfortunately, the creation of contacts still relies on lithography techniques, which do not provide the precision necessary to always properly align with a gate or adjacent diffusion area. FIGS. 1A and 1B illustrate how an opening 2 for a contact can be misaligned with a gate 4 or a diffusion 6. In FIG. 1A, a contact opening to the diffusion 6 was attempted, and in FIG. 1B, a contact opening to the gate 4 was attempted. If contacts are created using the illustrated openings, the contacts may cause shorts from the gate to the diffusions.

One remedy that has been propounded is creating an enlarged contact interface for the gate or diffusions. This solution, however, has the notable disadvantage of requiring more space.

In view of the foregoing, there is a need in the art for a method of forming a contact with a gate or a diffusion despite misalignment. It would also be advantageous if siliciding of the gate and/or diffusion were also possible with this method.

BRIEF SUMMARY OF THE INVENTION

The invention provides methods of forming a contact despite misalignment of the opening to the gate or diffusion and a semiconductor having such a contact. Silicide can be created on the gate and/or diffusion using the invention.

A first aspect of the invention is directed to a semiconductor comprising: a contact having a portion that extends on two opposing vertical sides of at least one vertical structure adjacent a gate electrode.

A second aspect of the invention is directed to a method of forming a contact, comprising the steps of: defining a vertical structure on a substrate; depositing a first layer on the substrate; selectively removing the first layer to form an opening having two edges spaced from one another, the opening exposing the vertical structure, at least one of the edges of the opening being disposed a distance from the vertical structure to define a masking space; depositing a second layer across the opening including the masking space; selectively removing the second layer outside the masking space while retaining at least a portion of the second layer within the masking space; and depositing a conductor within the opening and on a remaining portion of the second layer.

A third aspect of the invention provides a method of depositing a material in a first space of an opening without depositing the material in a second space of the opening, the opening and the first and second space being on or above a substrate, the second space having at least one lateral dimension that is smaller than the first space, the method comprising the steps of: forming a vertical structure on the substrate, the vertical structure being disposed in the opening to define the first and second space; depositing a layer so that the layer fills the second space and covers the first space; selectively removing the layer in the first space while retaining at least a portion of the layer in the second space; and depositing the material.

The foregoing and other features of the invention will be apparent from the following more particular description of embodiments of the invention.

BRIEF DESCRIPTION OF THE SEVERAL VIEWS OF THE DRAWINGS

The embodiments of this invention will be described in detail, with reference to the following figures, wherein like designations denote like elements, and wherein.

DETAILED DESCRIPTION OF THE INVENTION

Figure 1A:
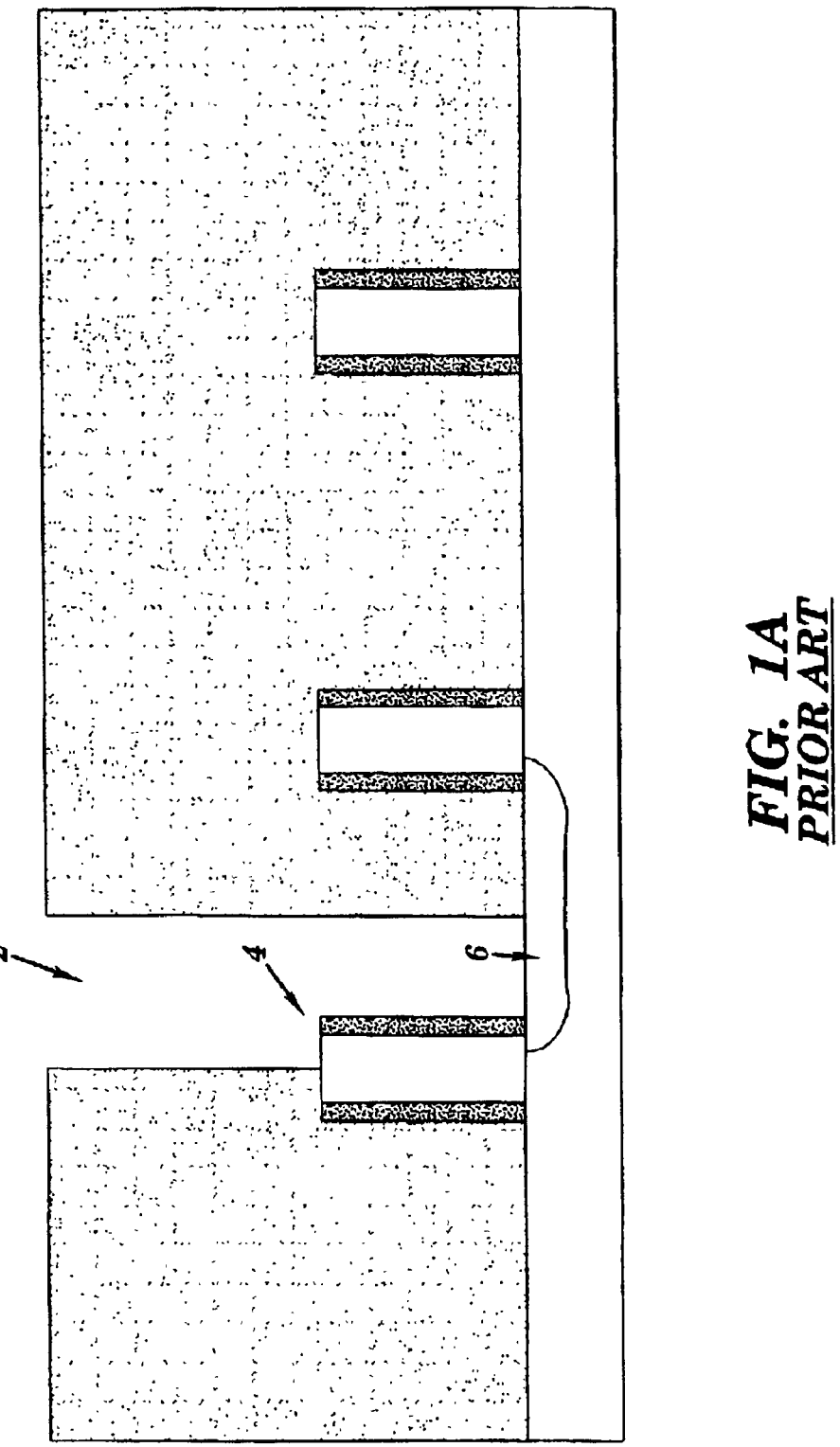
FIGS. 1A–B are cross-sectional views showing a misaligned contact opening according to a conventional method.
Figure 1B:
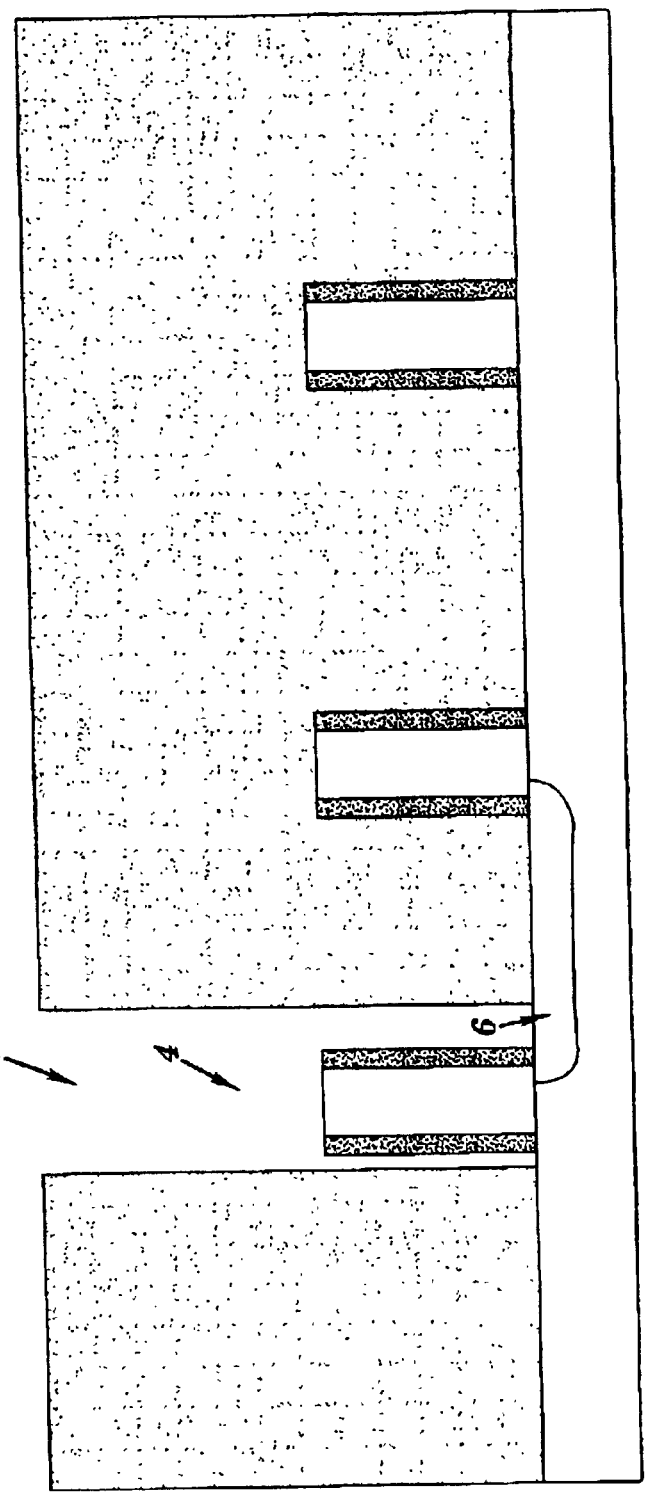

Referring to the drawings, the progression of manufacturing steps taken in producing a semiconductor having a contact is shown.

Figure 2:
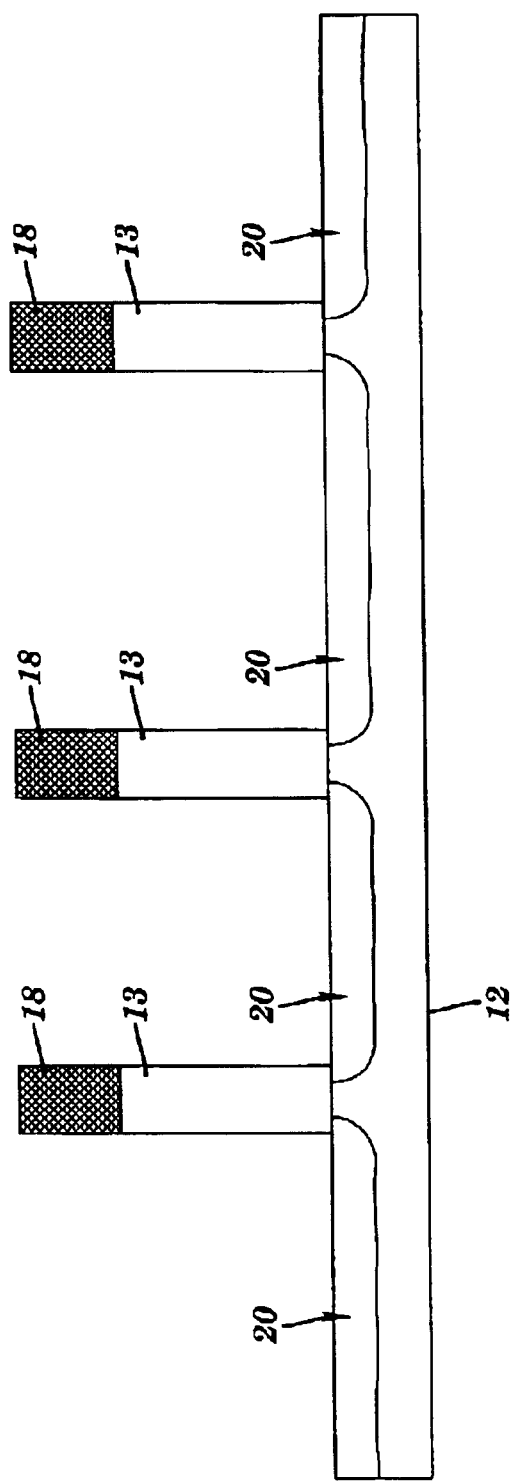
FIG. 2 is a cross-sectional view showing an initial step in the processes for producing a contact according to this invention.
Figure 3:
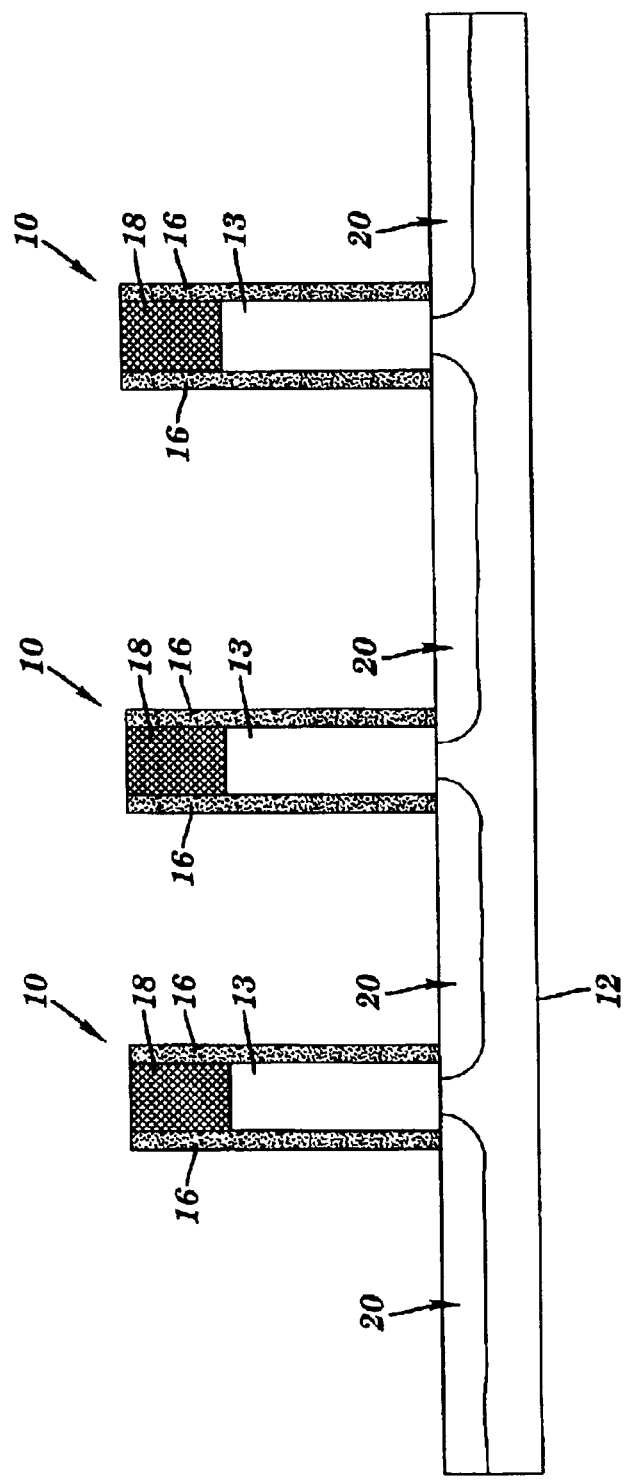
FIGS. 3–4 are cross-sectional views showing initial steps relative to formation of foundational structure for the invention.
Figure 4:
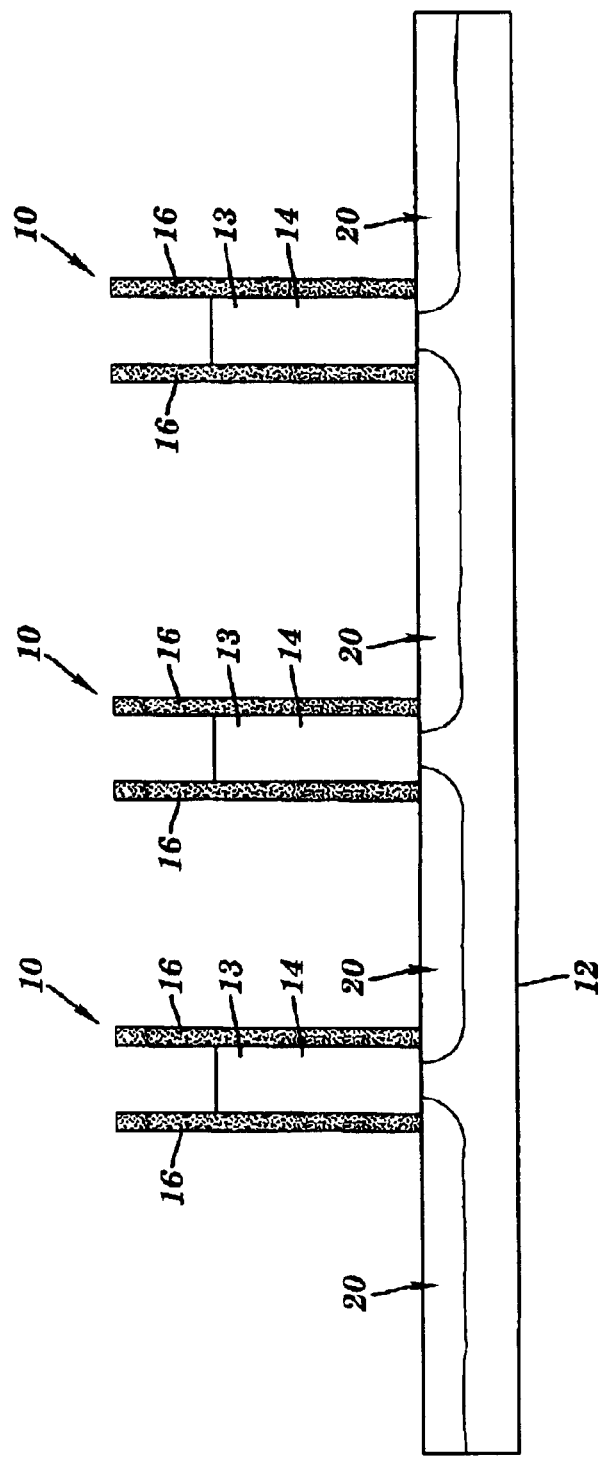

In a first step, a vertical structure 10 (FIGS. 3 and 4) is formed on a substrate 12. Vertical structure 10 includes at least one spacer 16 of a gate forming material 13 (FIGS. 3 and 4). Spacer(s) 16 may be made of, for example, high density silicon oxide, silicon nitride, silicon oxynitride, silicon carbide, etc. As shown in FIGS. 2–3, the formation of vertical structure 10 may begin by forming gate forming material 13 with a cap 18 thereon. In this embodiment, gate forming material 13 may be, for example, polysilicon. Cap 18 may be, for example, 50–70 nm thick (generally thicker than conventional caps) and may be made of, for example, low density oxide, low density silicon oxynitride or silicon nitride, all of which can be selectively removed with a wet etch relative to the spacers. Cap 18 material might also be a germanium material, which could be selectively removed with an RIE process. Gate forming material 13 and cap 18 may be formed by any now known or later developed techniques. In one embodiment, gate forming material 13 and cap 18 are patterned via a subtractive etch process once the polysilicon and silicon nitride are deposited, e.g., via chemical vapor deposition (CVD). As shown in FIG. 3, vertical structure 10 may be added adjacent gate forming material 13 by depositing a conformal layer of the spacer material (e.g., silicon oxide, silicon nitride, or silicon carbide) after gate forming material 13 is patterned and etched. After deposition of the conformal spacer film, it is processed with an RIE to remove the deposited material from the horizontal features of the device, while leaving the conformal layer on the vertical edges of gate forming material 13. Once vertical structure 10 (spacer(s) 16) are added, cap 18 is removed, e.g., by a wet etch process or an RIE process, to leave vertical structure 10 extending vertically beyond gate forming material 13, as shown in FIG. 4.

Figure 5:
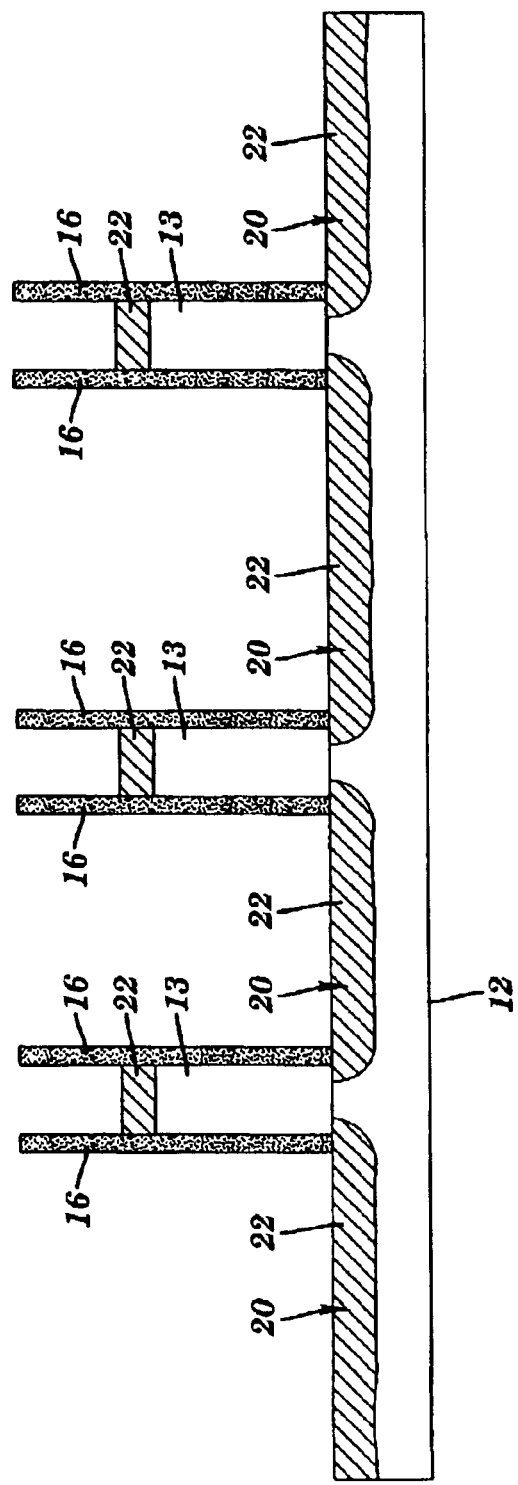
FIG. 5 is a cross-sectional view of an alternative step relative to the processes of FIGS. 2–4.

It should be recognized that other precursor steps to formation of vertical structure 10 may also be included such as forming a shallow trench isolation (STI) on bulk silicon substrate or silicon on insulator (SOI), or processing implants in a conventional fashion, etc. Further, other steps may occur following formation of vertical structure 10. For instance, ion implants for diffusions 20 may be provided by conventional techniques. In one particular alternative, referring to FIG. 5, silicide 22 may be created in gate material 13 and/or diffusions 20. Silicide 22 may be made of any well-known silicide material such as cobalt or nickel. An activation anneal may also be provided to create gate electrode 14 (FIG. 5) from polysilicon gate forming material 13.

Referring to FIGS. 6–11, an alternative processing that follows from that shown in FIG. 2 is shown. In this setting, a gate electrode is formed by damascene or replace gate processing. This processing allows use of high dielectric constant gate dielectric materials that are advantageous to reduce gate dielectric thickness for standard SiO2 processing. In particular, the following processing allows use of high dielectric materials because activation anneal (which requires very high temperatures that normally destroy high dielectric materials) occurs with a dummy gate forming material in the gate electrode and gate dielectric area. In addition, with the following processing, since metal gates are ultimately formed, there is no depletion, as with polysilicon, which normally adds thickness to the gate dielectric.

Figure 6:
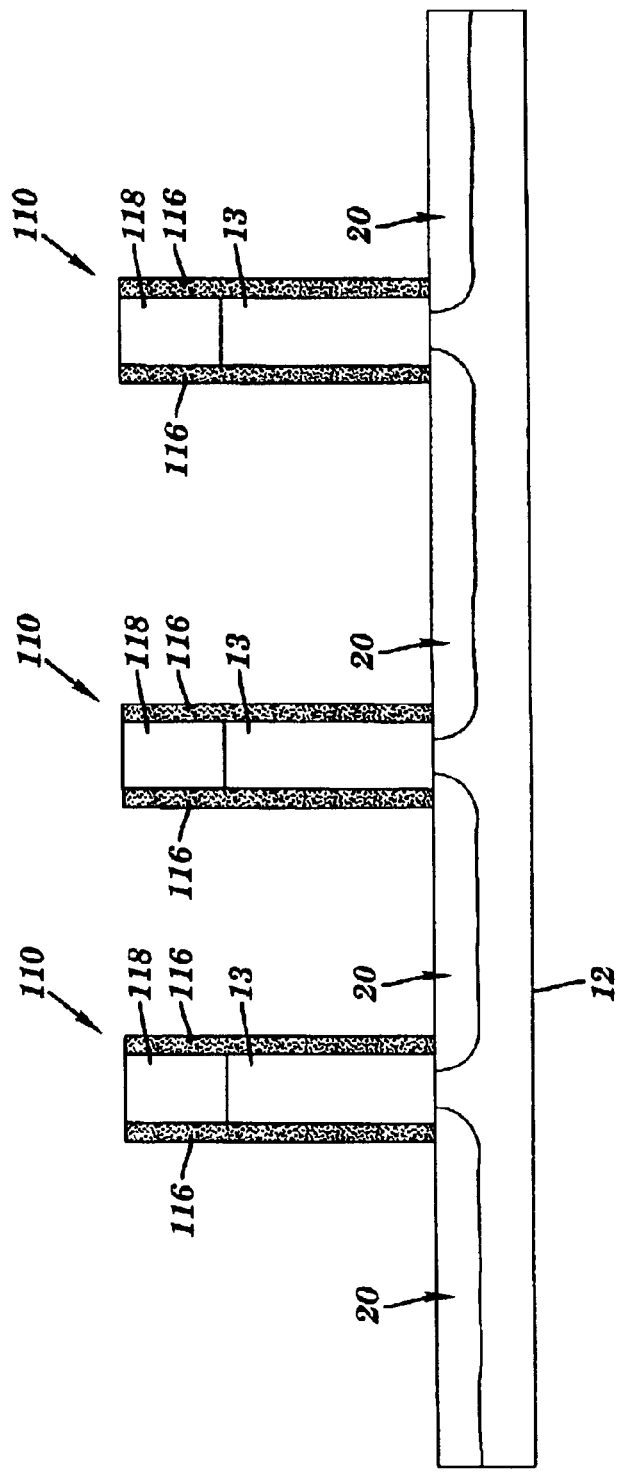
FIGS. 6–11 are cross-sectional views showing alternative processing to that of FIGS. 3–4.

Turning to the alternative processing, the formation of a vertical structure may begin by creating gate forming material 13 with a cap 18 as shown in FIG. 2. With this processing, however, gate forming material 13 and cap 18 may be slightly taller than that for the above-described processing. The materials of gate forming material 13 may be, for example, polysilicon, germanium, silicon germanium, or an organic material such as SiLK available from DOW CORNING, BLACK DIAMOND available from APPLIED MATERIALS, or COREL from LAM (as long as the subsequent layers [24 and 120 below] are different, such as oxide, so that the dummy gate can be selectively removed without attacking layers). Cap 18 is the same material as described above. In this alternative processing, as shown in FIG. 6, vertical structure 110 is added adjacent gate forming material 13 by depositing a conformal layer of a spacer material (e.g., silicon oxide, silicon nitride, silicon oxynitride, silicon carbide, etc.) that allows gate electrode material 13 to be removed. Also, cap 18 is removed, e.g., by etching. Other precursor steps to formation of vertical structure 110 may also be included such as forming a shallow trench isolation (STI) on bulk silicon substrate or silicon on insulator (SOI), or processing implants in a conventional fashion, etc. Further, other steps may occur following formation of vertical structure 10. For instance, ion implants for diffusions 20 may be provided by conventional techniques. In addition, an activation anneal may occur at this point, i.e., by heating them to approximately 1100Â° F.

Figure 7:
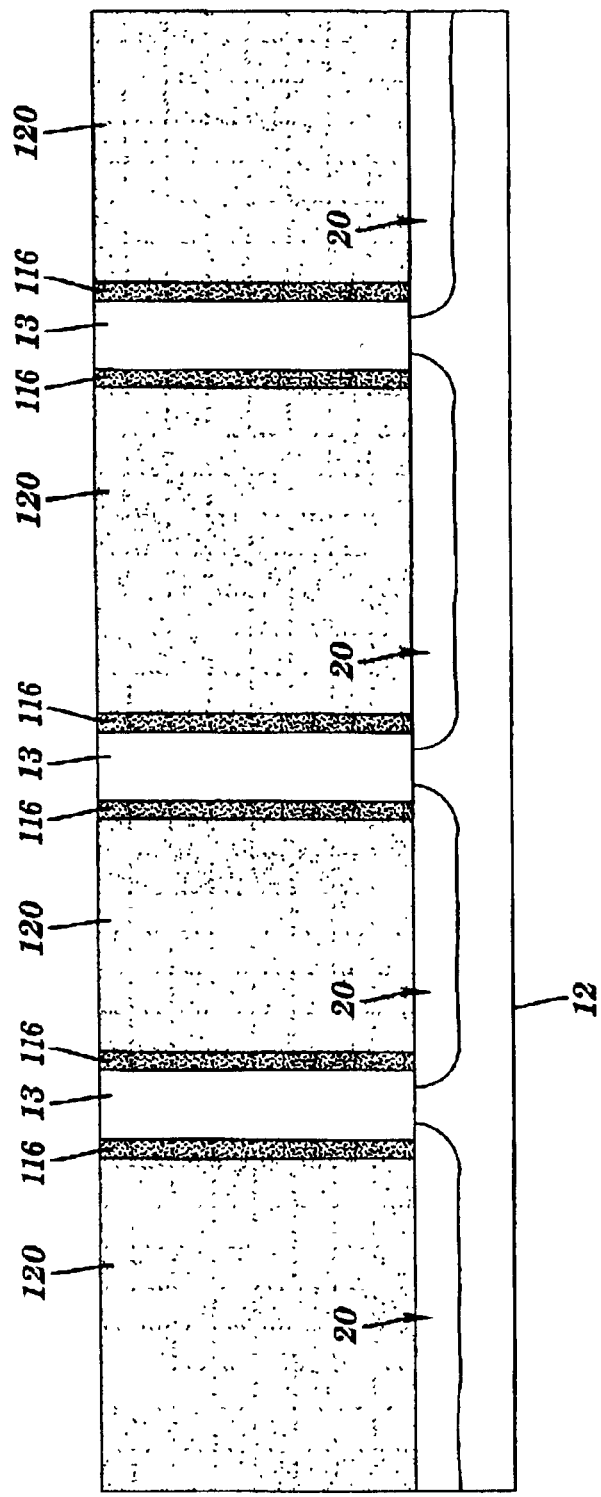
Figure 8:
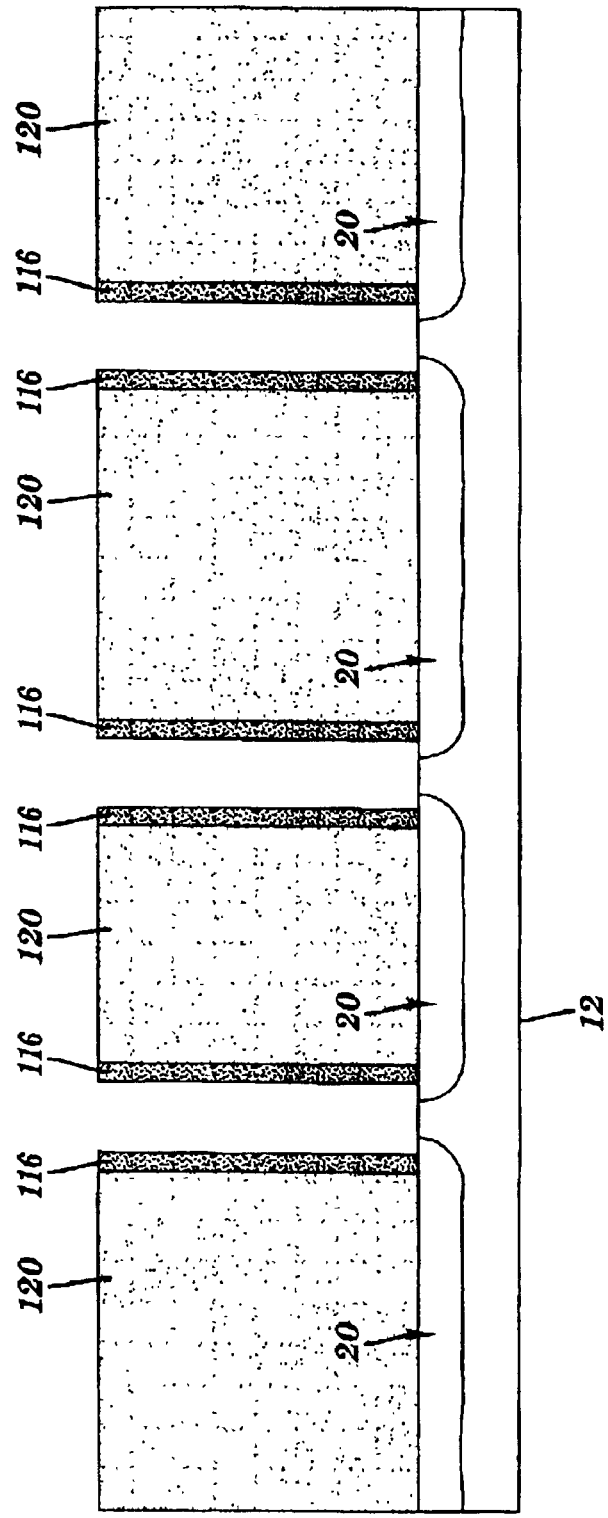

Next, as shown in FIG. 7, a dielectric layer 120 of, for example, low dielectric constant silicon (e.g., SiLK, BLACK DIAMOND, COREL, etc.) or oxide, is deposited. In some cases, for example, if spacer(s) 116 is silicon nitride or silicon carbide, layer 120 may be a silicon oxide derivative. Other organic low dielectric materials may also be suitable. Next, as shown in FIG. 8, gate forming material 13 is removed, e.g, by etching. It should be recognized that other processing such as providing an interface layer (not shown) between gate forming material 13 and substrate 12 to prevent removal of substrate 12 may also be required. This layer would be provided prior to the creation of gate forming material 13.

Figure 9:
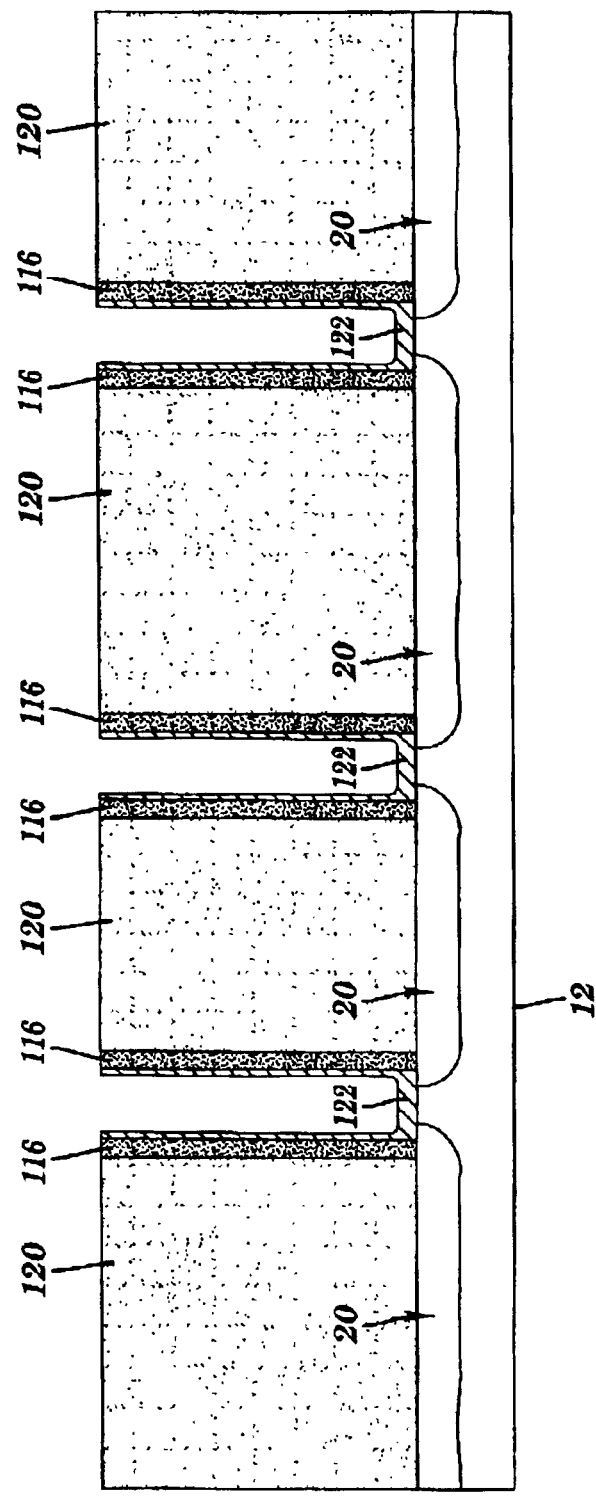
Figure 10:
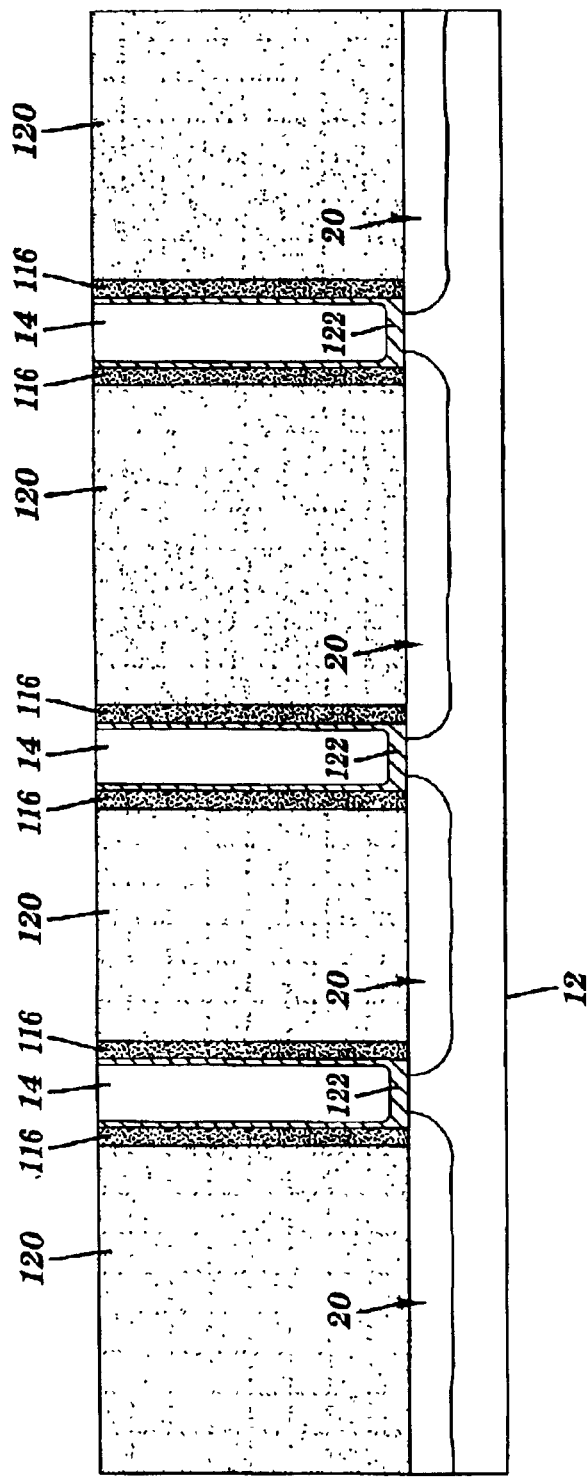
Figure 11:
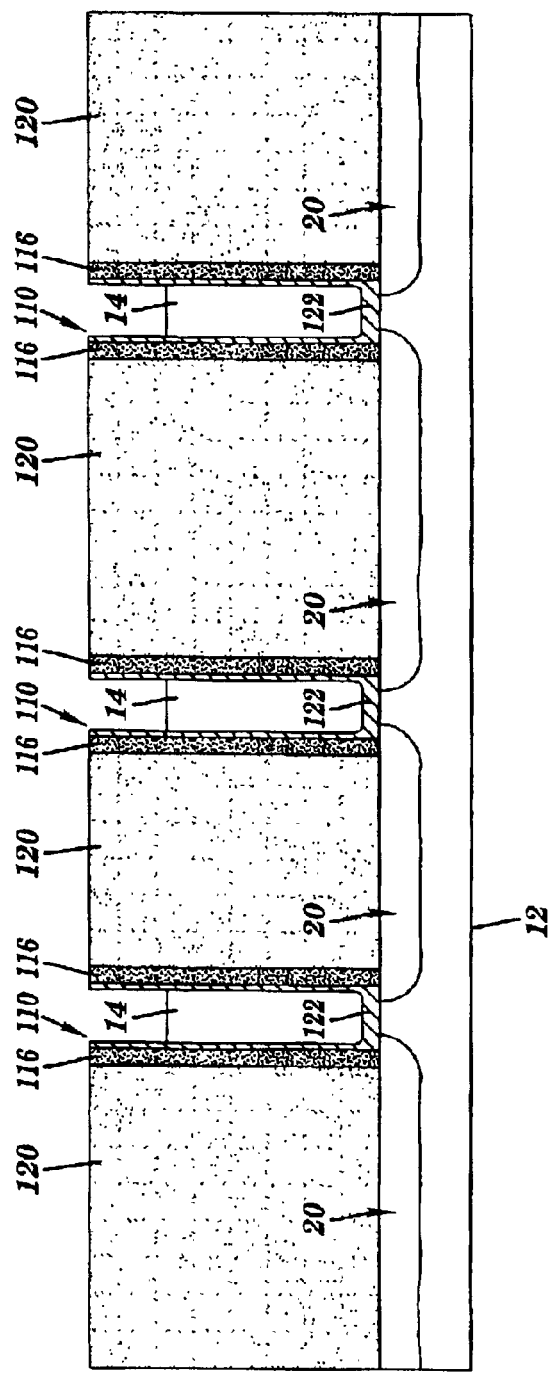

As shown in FIG. 9, a gate dielectric 122 is formed (not shown in FIGS. 13–20 for clarity). Next, as shown in FIG. 10, gate electrode 14 is formed in the area above gate dielectric 122. Gate electrode 14 may be made of any now known or later developed metal gate electrode material (e.g., dual band gaps material fills) such as tungsten. Next, as shown in FIG. 11, a portion of gate electrode 14 is removed, e.g., by etching, such that a top surface of gate electrode 14 is below a top surface of vertical structure 110, i.e., spacer(s) 116.

Figure 12:
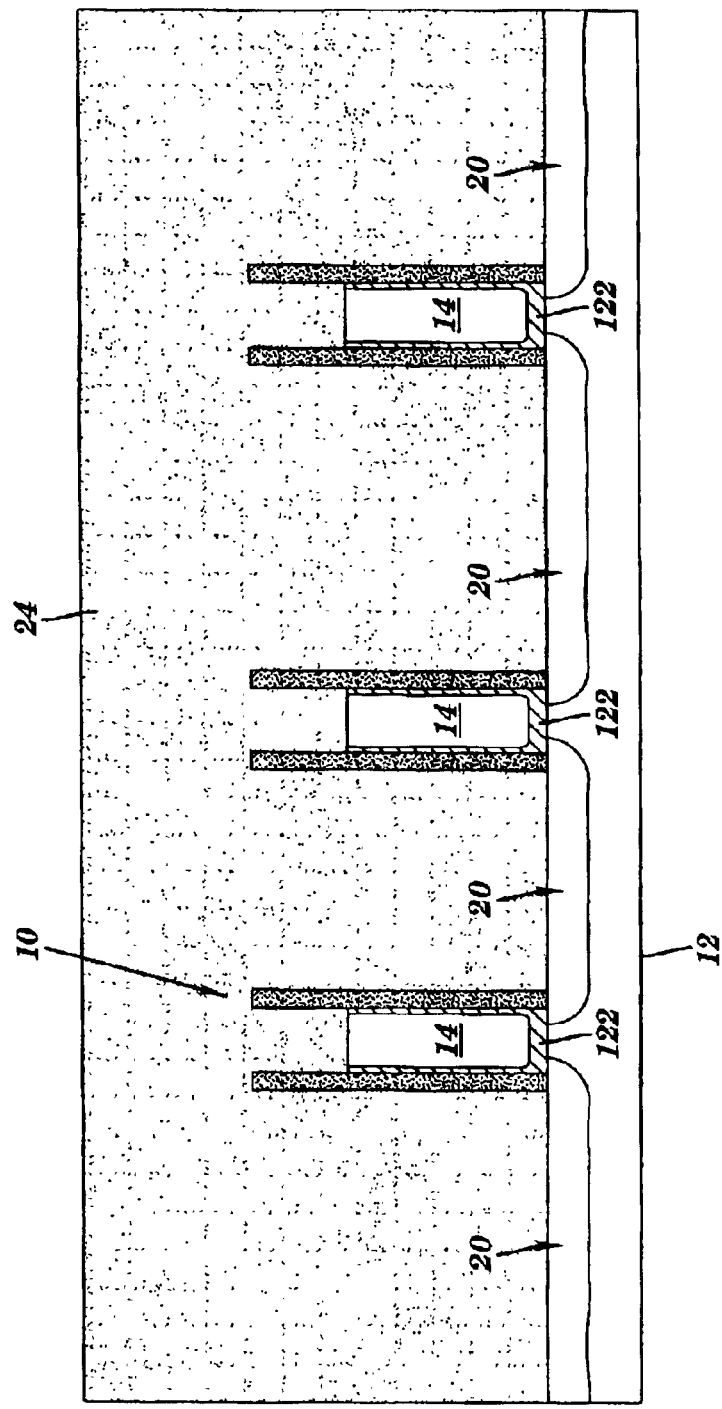
FIG. 12 is a cross-sectional view showing a first layer depositing step.

In a next step, shown in FIG. 12, a first layer 24 is deposited to fill the opening over gate electrode 14. First layer 24, in one embodiment, may be a low dielectric silicon (e.g., SiLK available from Dow Corning or Black Diamond available from Applied Materials), oxide, silicon nitride, silicon carbide, a silicon oxide derivative, or other organic low dielectric materials. First layer 24 may also be provided using any appropriate hard masks. With regard to the embodiment of FIGS. 3–4, first layer 24 also fills the space between gate electrode 14/spacer 16. With regard to the alternative processing of FIGS. 6–11, first layer 24 may be substantially the same material as dielectric layer 120 so as to form an integral layer. For purposes of further description, layer 120 and first layer 24 will be collectively referred to as first layer 24.

Figure 13:
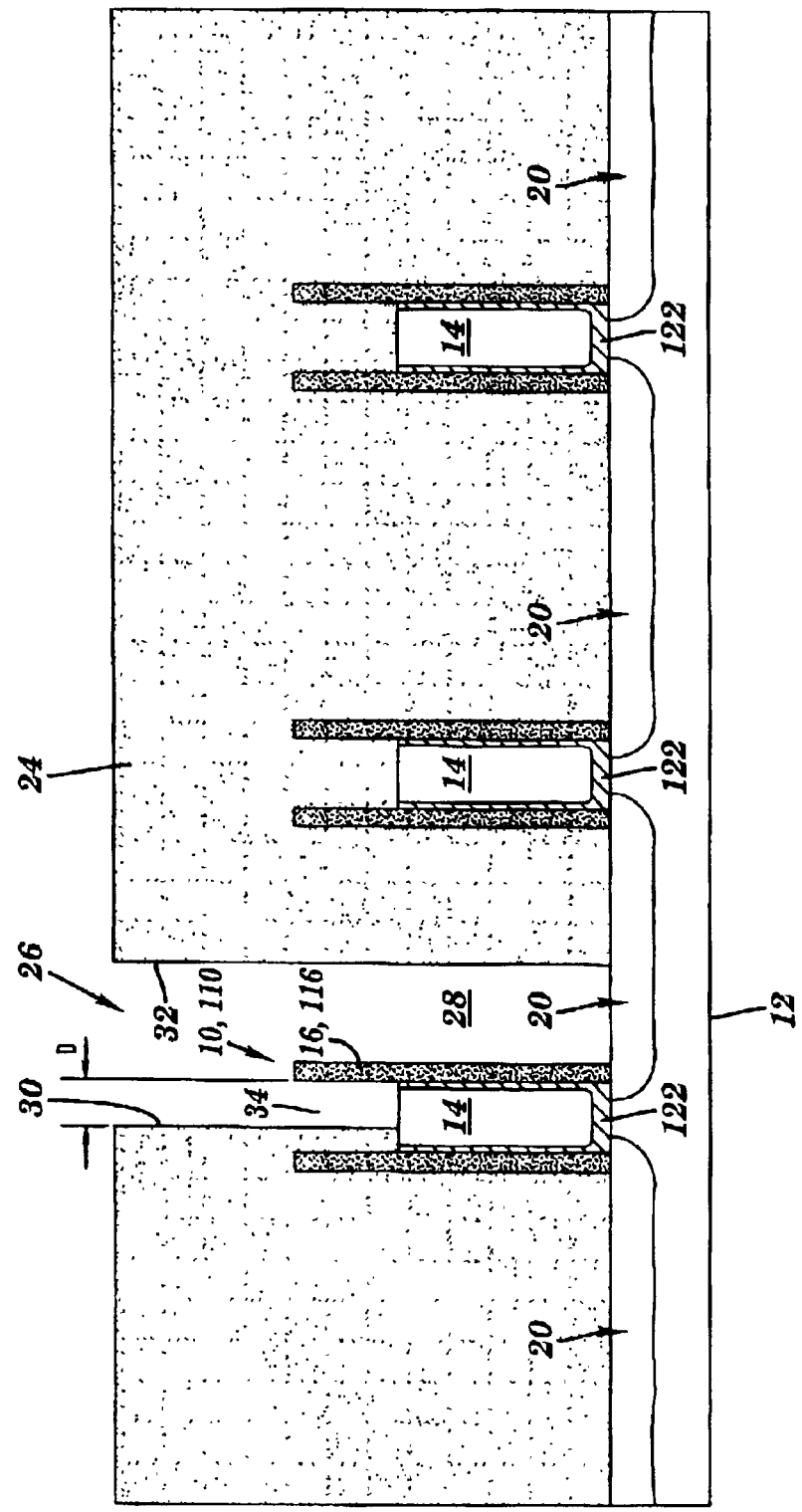
FIGS. 13–14 are cross-sectional views showing a removing step to create a contact opening.
Figure 14:
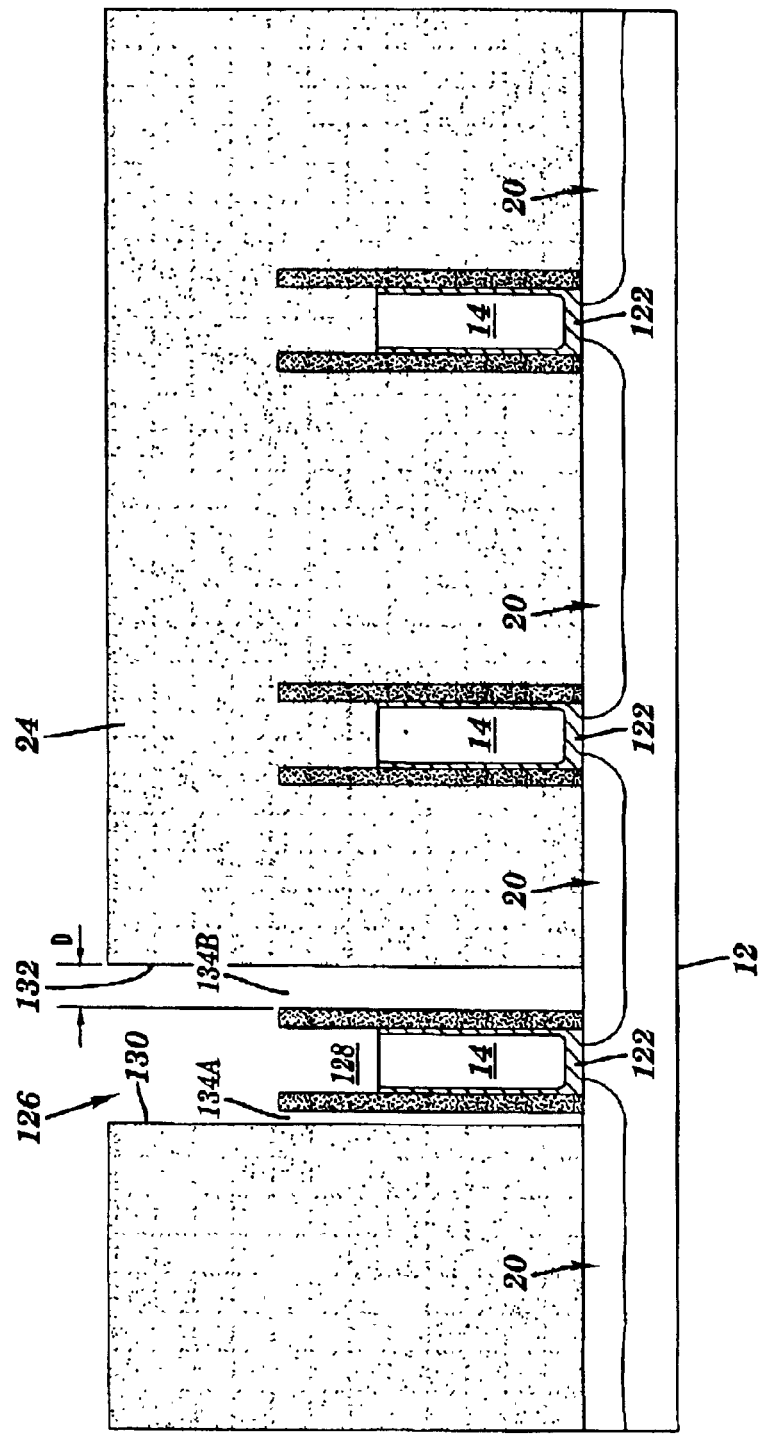

In a next step, shown in FIGS. 13 and 14, first layer 24 is selectively removed to form an opening for a contact. Removal may be made by any now known or later developed etching methods. When gate electrode 14 is constructed at a sub-lithographic size, current lithography techniques used to create the opening are not accurate enough to avoid exposing at least a portion of vertical structure 10, 110 and gate electrode 14.

FIG. 13 illustrates an attempt to create a contact opening 26 to diffusions 20, but which also exposes vertical structure 10 and, hence, gate electrode 14. Opening 26 has two edges 30, 32 that are spaced from one another. In this situation, a first space(s) 28 is defined between vertical structure 10, 110 (spacer 16, 116) and edge 32. Further, edge 30 of opening 26 is disposed a distance D from vertical structure 10, 110 (spacer 16, 116) to define a second, masking space 34. In this case, second masking space 34 has a lateral dimension that is smaller than first space 28.

FIG. 14 illustrates a situation where first layer 24 is selectively removed to form an opening 126 as an attempt to create a contact opening to gate electrode 14. Opening 126 has two edges 130, 132 that are spaced from one another. As shown, the lithography techniques used to create opening 126 are not accurate enough to avoid exposing at least a portion of the vertical structure and substrate 12. In the illustrated situation, the vertical structure is exposed and a first space 128 is defined by the vertical structure (spacers). In addition, each edge 130, 132 of opening 126 is disposed a distance D (shown only for edge 132) from the vertical structure to define a second, masking space 134A, 134B, respectively. In this situation, each masking space 134A, 134B has a lateral dimension that is smaller than first space 128.

The two particular situations illustrated in FIGS. 13 and 14 are meant to be exemplary. As one with skill in the art will recognize, the misalignment of openings 26, 126 may occur in a variety of non-illustrated fashions, all of which are correctable using the invention. In any situation, first space 28, 128 and second masking space 34, 134 may be on or above substrate 12. Further, vertical structure 10, 110 may be provided as some structure other than a spacer.

Figure 15:
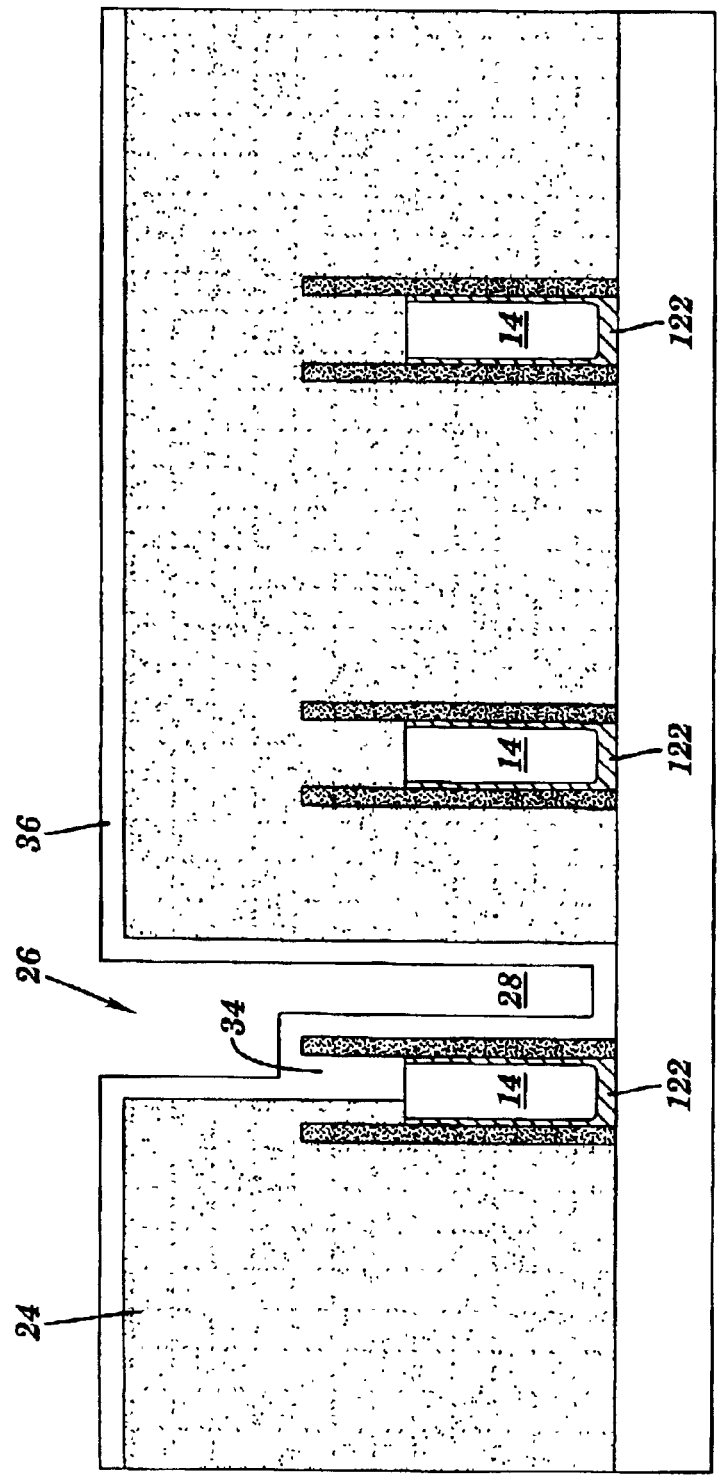
FIGS. 15–16 are cross-sectional views showing a second layer depositing step.
Figure 16:
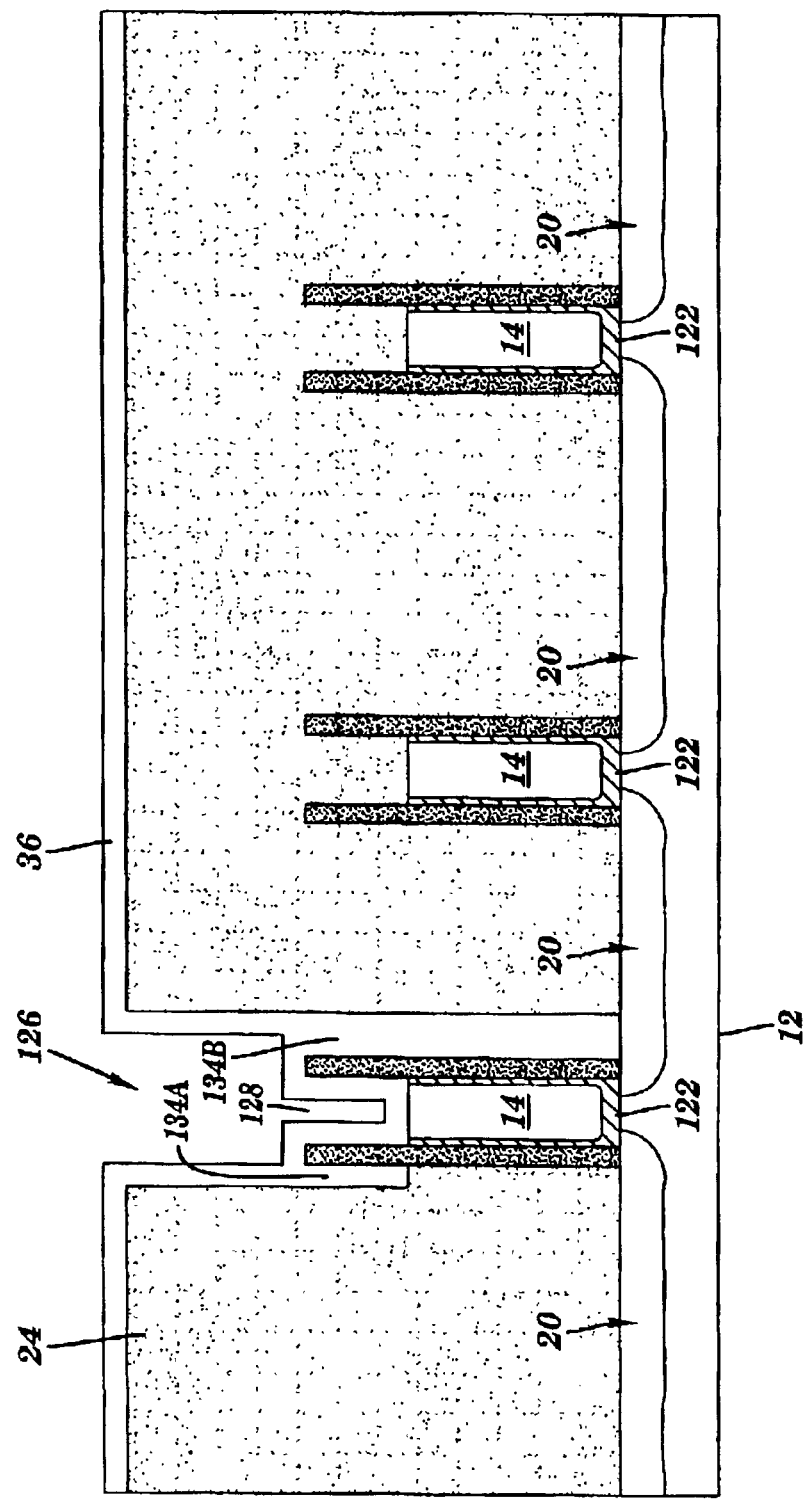

Explanation of the methodology of the invention will continue with reference to FIGS. 15 and 16. FIG. 15 illustrates opening 26 of FIG. 13, and FIG. 16 illustrates opening 126 of FIG. 14. For brevity sake, detailed explanation will be made with reference to FIG. 15 only. The next step includes depositing a second layer 36 across opening 26 in first layer 24 including masking space 34. In this regard, distance D is sized to allow filling of masking space 34 with second layer 36. Since first space 28 is larger, second layer 36 does not fill first space 28, but rather covers it. Second layer 36, in one embodiment, is a conformal layer or filling dielectric film such as silicon oxide, germanium oxide, or different grades of oxide. Second layer 36 could also be a low density form of silicon oxynitride that can be removed with dilute HF solutions or with an isotropic plasma etch. Further, layer 26 might also be a composite mixture of silicon oxide and germanium oxide, chosen to allow solubility in dilute HF. It might also be a low dielectric material, such as those noted above, if first layer 24 is oxide. In addition, any now known or later developed silicon-carbon-oxygen species of film may be suitable. Second layer 36 is able to remain post-processes as part of wafer, and is selectively isotropically etchable. With reference to FIG. 16, similar depositing of second layer 36 to cover opening 126 in first layer 24 including masking space 134 is made. In this regard, distance D is sized to allow filling of masking space 34 with second layer 36, while first space 128 is simply covered.

Figure 17:
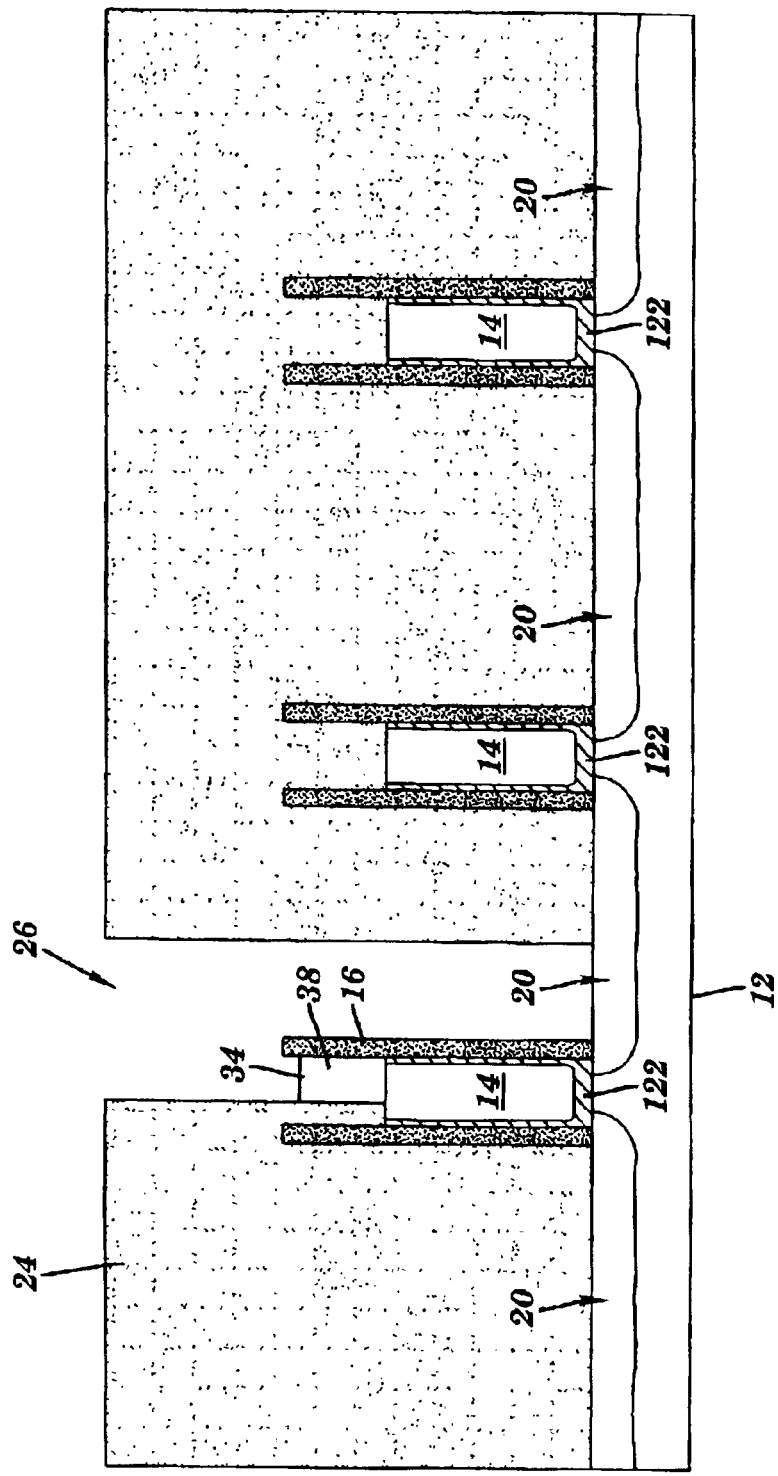
FIGS. 17–18 are cross-sectional views showing a step of selectively removing the second layer.
Figure 18:
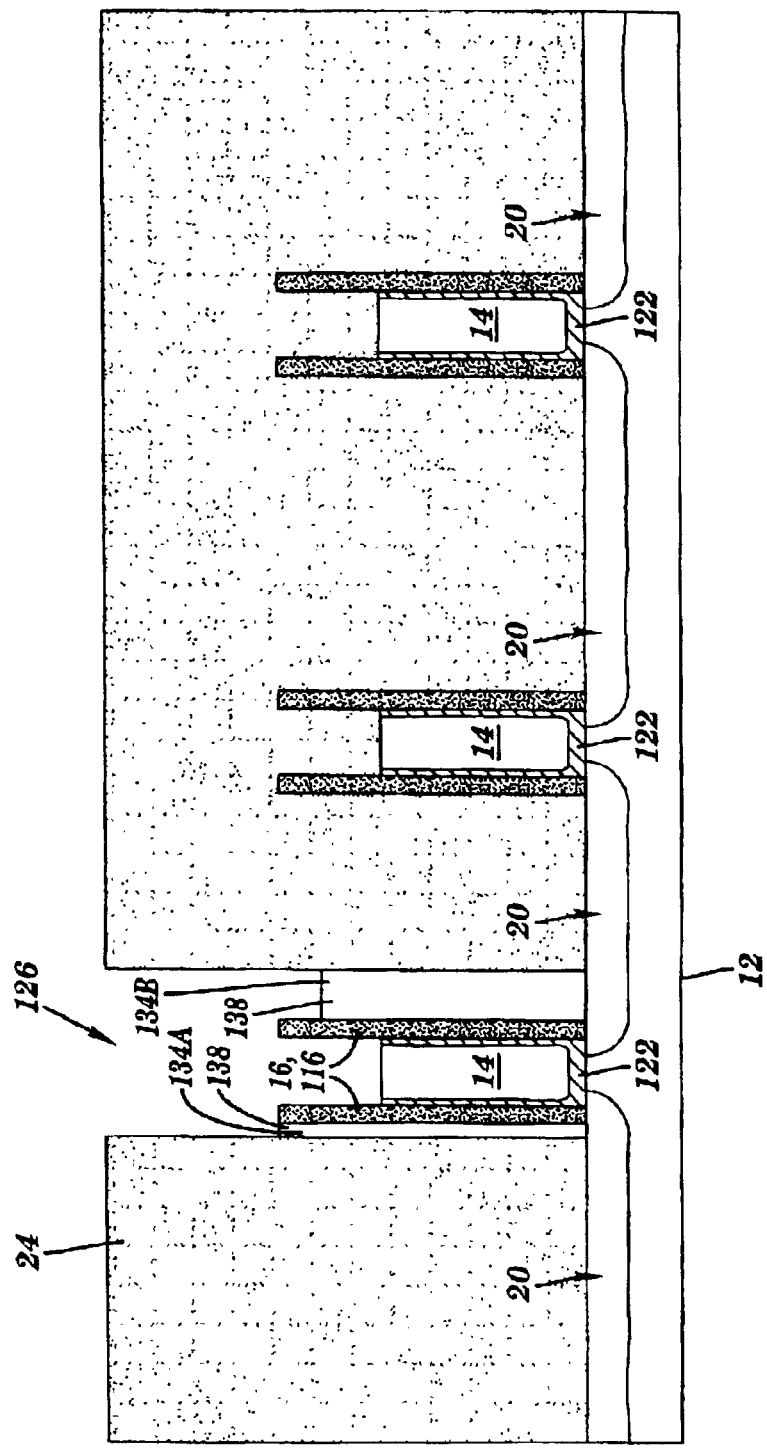

As shown in FIGS. 17 and 18, the next step includes selectively removing second layer 36 outside masking space 34, 134 while retaining at least a portion 38, 138 of the second layer within masking space 34, 134. Removal may be made by any now known or later developed etching method. In one embodiment, second layer 36 is removed by an isotropic etch. Removal of second layer 36 extends beyond the uppermost portion of vertical structure 10, i.e., the uppermost portion of spacer(s) 16. The extent to which removal proceeds may depend on the size of masking space 34, 134. For instance, as shown in FIG. 20, the level of second layer remaining in masking space 134A is higher than that of larger masking space 134B.

Figure 19:
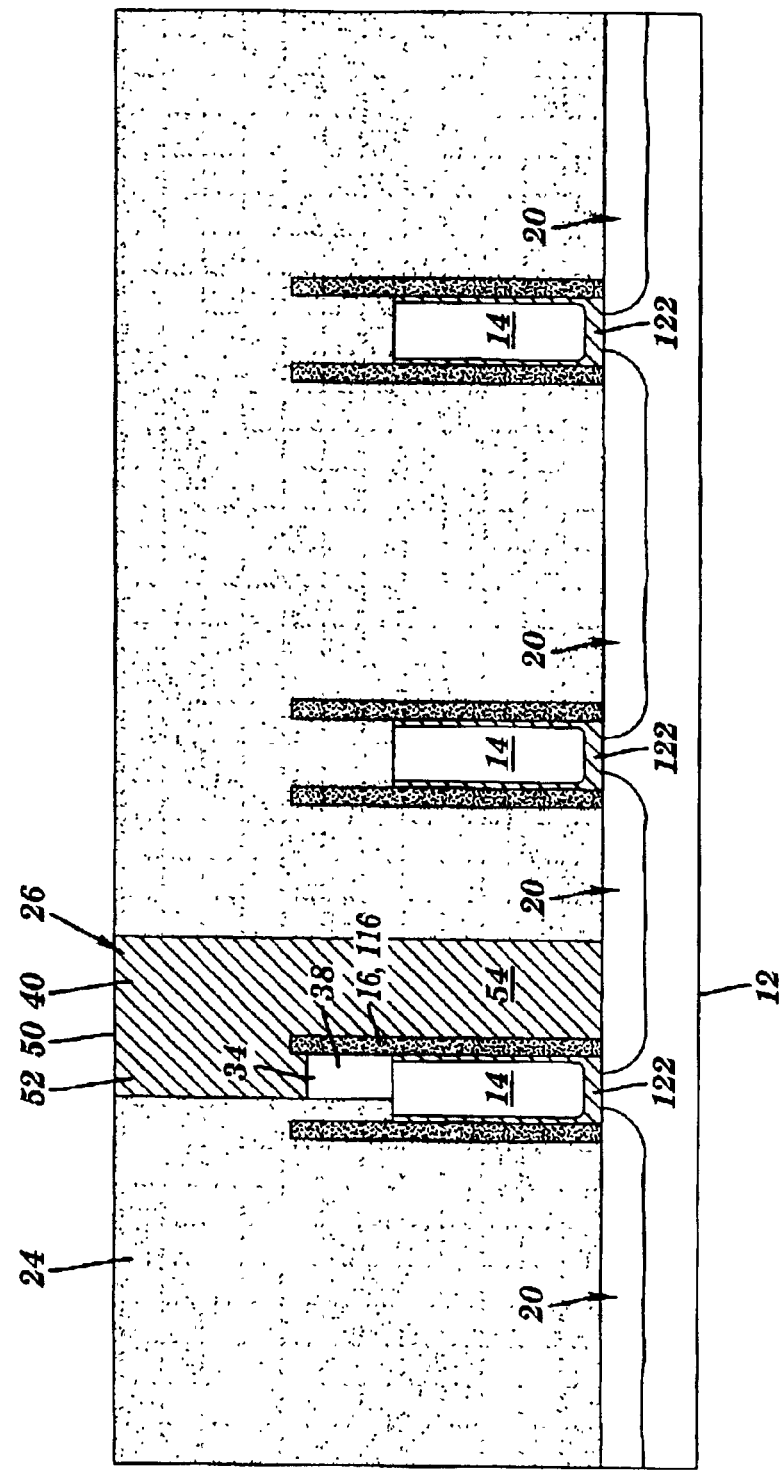
FIGS. 19–20 are cross-sectional views showing contacts created by the invention.
Figure 20:
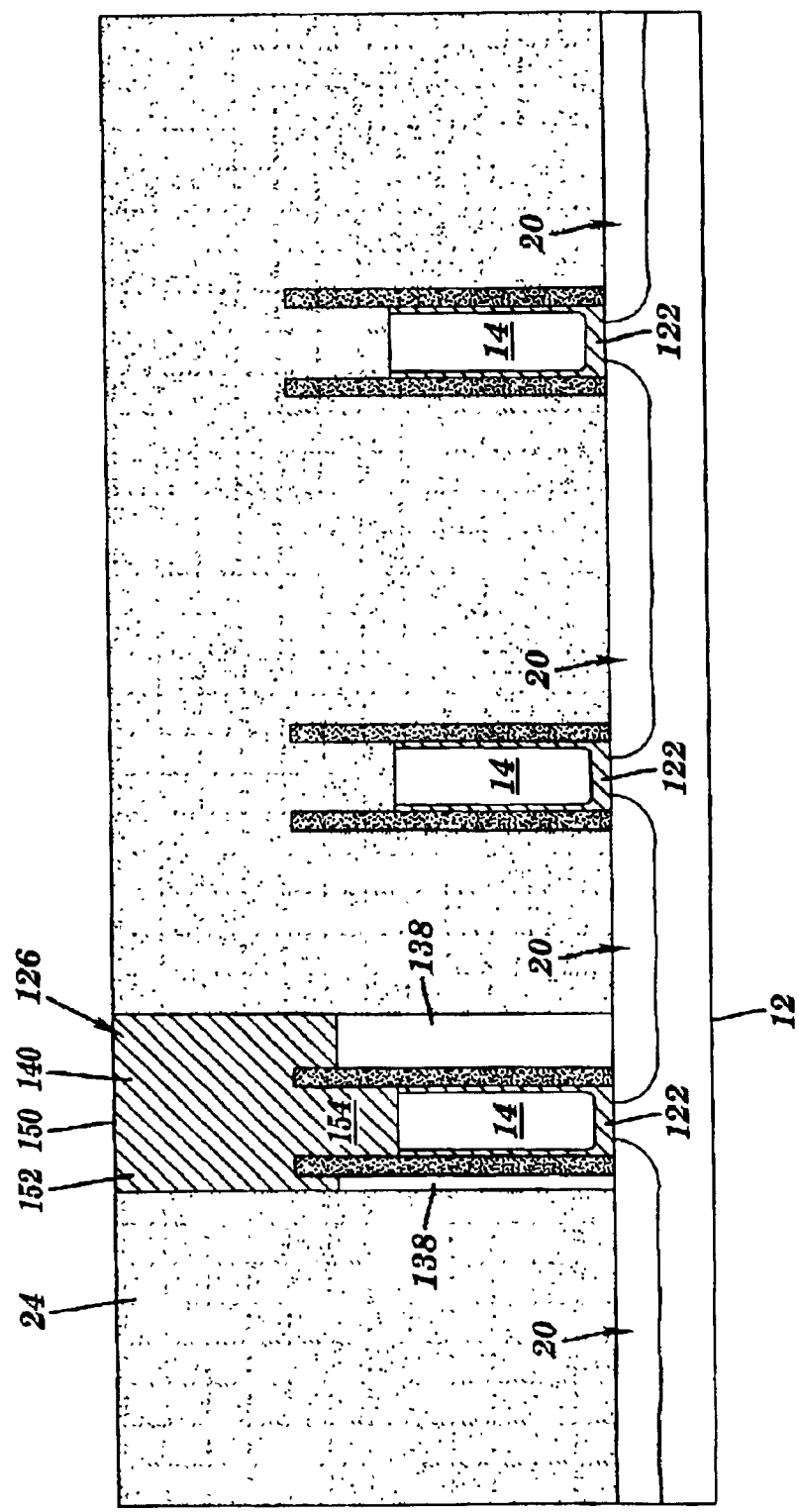

As shown in FIGS. 19 and 20, depositing a conductor 40, 140 within opening 26, 126 and on a remaining portion 38, 138 of the second layer is next. As part of this step, liner films (not shown) may also be applied, if necessary. Conductor 40, 140 may be any conductive material such as copper, aluminum, tungsten, titanium nitride, etc. In FIG. 19, masking space 34 is over gate electrode 12 and conductor 40 contacts substrate 12, e.g., diffusions 20. In FIG. 20, masking space 134 is in contact with substrate 12 and conductor 140 contacts gate electrode 12. The resulting conductor, in either scenario, has a portion that extends on two vertical sides of at least one spacer 16. In other words, conductor extends beyond an uppermost portion of spacer(s) 16 on two vertical sides.

The invention also includes a semiconductor formed by the above process. Semi-conductor includes a contact 50, 150 (FIGS. 19 and 20, respectively) having a contact having a portion that extends on two vertical sides of at least one vertical structure 10 adjacent a gate electrode 14. The contact does not horizontally overlap an adjacent second gate electrode. As shown in FIG. 19, contact 50 may contact substrate 12 adjacent spacer 16. Alternatively, as shown in FIG. 20, contact 150 may contact gate electrode 14. As also shown in FIGS. 19 and 20, contact 50, 150 includes an upper portion 52, 152 that is larger than a lower, contact portion 54, 154.

Contact 50, 150 created by the above-described processes provides a mechanism to contact either gate electrode 14 or substrate 12 and provides a larger target (i.e., upper portion 52, 152) for wire bond or other connections despite contact opening misalignment.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A semiconductor comprising:
   a contact having a portion that extends on two opposing vertical sides of a vertical structure adjacent a first gate electrode, and wherein the contact contacts a diffusion adjacent the first gate electrode and is insulated horizontally from an adjacent second gate electrode and a spacer adjacent the second gate electrode by an insulating layer; and
   a masking layer for insulating the first gate electrode from the contact.

2. The semiconductor of claim 1, wherein the contact includes an upper portion that is larger than a lower contact portion.

3. The semiconductor of claim 1, wherein the vertical structure is a spacer.

4. The semiconductor of claim 3, wherein the contact contacts a substrate adjacent the spacer.

5. The semiconductor of claim 1, wherein the contact does not horizontally overlap the adjacent second gate electrode.

* * * * *